(12) United States Patent
Chien et al.

(10) Patent No.: US 10,439,314 B2
(45) Date of Patent: Oct. 8, 2019

(54) ELECTRICAL PLUG CONNECTOR

(71) Applicant: ADVANCED-CONNECTEK INC., New Taipei (TW)

(72) Inventors: Min-Lung Chien, New Taipei (TW); Ming-Yung Chang, New Taipei (TW); Chun-Hung Chen, New Taipei (TW); Cheng-Che Tsai, New Taipei (TW)

(73) Assignee: ADVANCED-CONNECTEK INC., New Taipei (TW)

( * ) Notice: Subject to any disclaimer, the term of this patent is extended or adjusted under 35 U.S.C. 154(b) by 0 days.

(21) Appl. No.: 16/045,203

(22) Filed: Jul. 25, 2018

(65) Prior Publication Data

US 2019/0036264 A1 Jan. 31, 2019

(30) Foreign Application Priority Data

Jul. 26, 2017 (TW) .............................. 106211017 U

(51) Int. Cl.
| | |
|---|---|
| *H01R 13/648* | (2006.01) |
| *H01R 13/405* | (2006.01) |
| *H01R 12/72* | (2011.01) |
| *H01R 13/6582* | (2011.01) |
| *H01R 13/66* | (2006.01) |

(Continued)

(52) U.S. Cl.
CPC ......... *H01R 13/405* (2013.01); *H01R 12/724* (2013.01); *H01R 13/506* (2013.01); *H01R 13/652* (2013.01); *H01R 13/6582* (2013.01); *H01R 13/6658* (2013.01); *H01R 13/642* (2013.01); *H01R 24/60* (2013.01); *H01R 2107/00* (2013.01); *H05K 1/117* (2013.01); *H05K 2201/10189* (2013.01)

(58) Field of Classification Search
CPC ......................... H01R 23/688; H01R 23/6873; H01R 13/658; H01R 23/7073
USPC ...... 439/108, 607.09, 607.35, 607.36, 607.4, 439/607.55, 660
See application file for complete search history.

(56) References Cited

U.S. PATENT DOCUMENTS

| | | | |
|---|---|---|---|
| 7,503,802 B2* | 3/2009 | Tu ........................ | H01R 25/003 439/540.1 |
| 7,654,866 B2* | 2/2010 | He ....................... | H01R 12/707 439/607.01 |

(Continued)

*Primary Examiner* — Thanh Tam T Lee
(74) *Attorney, Agent, or Firm* — Muncy, Geissler, Olds & Lowe, PC

(57) ABSTRACT

An electrical plug connector includes a first terminal module and a second terminal module disposed inside a metallic shell. The first terminal module includes a first insulated member and first plug terminals, a first combining portion, and a first conductive strip assembled on the first insulated member. The second terminal module includes a second insulated member and second plug terminals, a second combining portion, and a second conductive strip assembled on the second insulated member. The first terminal module and the second terminal module are formed by different plastic injection molds, and therefore the assembly of the first plug terminals, the second plug terminals, the first combining portion, and the second combining portion on the first insulated member and the second insulated member becomes easy. No additional Mylar film is utilized because no terminal groove appears on the outer surface of the first insulated member and the second insulated member.

17 Claims, 10 Drawing Sheets

(51) Int. Cl.
*H01R 13/652* (2006.01)
*H01R 13/506* (2006.01)
H01R 13/642 (2006.01)
H01R 107/00 (2006.01)
H05K 1/11 (2006.01)
H01R 24/60 (2011.01)

(56) References Cited

U.S. PATENT DOCUMENTS

| | | | | |
|---|---|---|---|---|
| 7,811,131 | B2* | 10/2010 | Wang | H01R 12/714 |
| | | | | 439/607.35 |
| 7,918,688 | B2* | 4/2011 | Lin | H01R 12/58 |
| | | | | 439/607.01 |
| 8,033,868 | B2* | 10/2011 | Wang | H01R 13/405 |
| | | | | 439/660 |
| 8,052,461 | B2* | 11/2011 | Wang | H01R 4/2433 |
| | | | | 439/405 |
| 8,172,620 | B2* | 5/2012 | Su | H01R 13/42 |
| | | | | 439/607.01 |

* cited by examiner

ELECTRICAL PLUG CONNECTOR

CROSS-REFERENCE TO RELATED APPLICATION

This non-provisional application claims priority under 35 U.S.C. § 119(a) to Patent Application No. 106211017 in Taiwan, R.O.C. on Jul. 26, 2017, the entire contents of which are hereby incorporated by reference.

FIELD OF THE INVENTION

The instant disclosure generally relates to an electrical connector, and more particularly, to an electrical plug connector.

BACKGROUND

Generally, Universal Serial Bus (USB) is a serial bus standard to the PC architecture with a focus on computer interface, consumer and productivity applications. The existing Universal Serial Bus (USB) interconnects have the attributes of plug-and-play and ease of use by end users. Now, as technology innovation marches forward, new kinds of devices, media formats and large inexpensive storage are converging. They require significantly more bus bandwidth to maintain the interactive experience that users have come to expect. In addition, the demand of a higher performance between the PC and the sophisticated peripheral is increasing. The transmission rate of USB 2.0 is insufficient. As a consequence, faster serial bus interfaces such as USB 3.0, are developed, which may provide a higher transmission rate so as to satisfy the need of a variety devices.

The appearance, the structure, the contact ways of terminals, the number of terminals, the pitch between terminals, and the pin assignment of terminals of a current USB Type-C electrical plug connector are entirely different from those of a conventional USB electrical plug connector. The current USB Type-C electrical plug connector includes a plastic core, a plurality of plug terminals disposed on the plastic core, an outer iron shell annularly enclosing the plastic core, and conductive strips disposed on the plastic core.

SUMMARY OF THE INVENTION

The insulating plastic core of the USB Type-C electrical plug connector has a one-piece annular structure, in which there are terminal grooves extending to the outer surface. The front ends of the terminals are disposed in the terminal grooves and a Mylar film is attached onto the outer surface of the annular structure to cover the terminal grooves so as to prevent the front ends of the terminals from contacting the outer iron shell. Therefore, the conventional annular structured insulating plastic core has the terminal grooves extending to the outer surface covered by a Mylar film, which results in higher cost of components and complexity of assembling processes.

In view of the above, the instant disclosure provides an electrical plug connector. One embodiment of the electrical plug connector includes a metallic shell, a first terminal module, and a second terminal module. The first terminal module includes a first insulated member, a plurality of first plug terminals, and a first conductive strip. The first conductive strip is disposed on the first insulated member. A plurality of first terminal grooves and a first fixing member are formed on an inner surface of the first insulated member. The first plug terminals are positioned in the first terminal grooves. The second terminal module includes a second insulated member, a plurality of second plug terminals and a second conductive strip. The second conductive strip is disposed on the second insulated member. A plurality of second terminal grooves and a second fixing member are formed on an inner surface of the second insulated member. The second plug terminals are positioned in the second terminal grooves. The second fixing member is buckled with the first fixing member. The first insulated member is combined with the second insulated member to form a tubular member inserted into a receiving cavity surrounded by the metallic shell. The tubular member surrounds a mating room.

In some embodiments, the first insulated member includes a first combining portion formed on the inner surface of the first insulated member and combined with the first plug terminals. The first fixing member is disposed on one side of the first combining portion. The first insulated member extends to form a first base disposed at one end of the first combining portion. The first plug terminals include a plurality of first signal terminals, at least one first power terminal and at least one first ground terminal. One of a plurality of first limiting grooves is formed at a front end of each of the first terminal grooves on the inner surface of the first insulated member and one of a plurality of second limiting grooves is formed at a front end of each of the second terminal grooves on the inner surface of the second insulated member.

In some embodiments, each of the first plug terminals includes a first flexible contact portion, a first body portion and a first tail portion. The first body portion is disposed on the first combining portion. The first flexible contact portion extends forward, in the rear-to-front direction, from the first body portion to one of the first limiting grooves. The first tail portion extends backward, in the front-to-rear direction, from the first body portion to penetrate through the first combining portion.

In some embodiments, the second insulated member includes a second combining portion formed on the inner surface of the second insulated member and combined with the second plug terminals. The second fixing member is disposed on a first side of the second combining portion. The second insulated member extends to form a second base disposed at one end of the second combining portion.

In some embodiments, each of the second plug terminals includes a second flexible contact portion, a second body portion and a second tail portion. The second body portion is disposed on the second combining portion. The second flexible contact portion extends forward, in the rear-to-front direction, from the second body portion to one of the second limiting grooves. The second tail portion extends backward, in the front-to-rear direction, from the second body portion to penetrate through the second combining portion. The second plug terminals include a plurality of second signal terminals, at least one second power terminal and at least one second ground terminal.

In some embodiments, a protuberant column forming the second fixing member is disposed on the first side of the second combining portion.

In some embodiments, the electrical plug connector further includes a grounding sheet disposed between the first insulated member and the second insulated member. A buttonhole penetrating through the protuberant column is formed on the grounding sheet.

In some embodiments, the electrical plug connector further includes a first fixing strip disposed on one end of the first insulated member and a second fixing strip disposed on one end of the second insulated member.

In some embodiments, the first conductive strip and the second conductive strip are attached onto an outer surface of the first insulated member and an outer surface of the second insulated member, respectively, and the first conductive strip and the second conductive strip include a plurality of first resilient arms and a plurality of second resilient arms extending into the mating room, respectively.

In some embodiments, the first conductive strip includes a first side-positioning piece and a first contact member on both ends thereof, and the second conductive strip includes a second side-positioning piece and a second contact member on both ends thereof. The first side-positioning piece and the second side-positioning piece are attached onto the first insulated member and the second insulated member, respectively. The first contact member and the second contact member contact an inner surface of the metallic shell. The first insulated member includes a clamping member on both sides thereof, and the second insulated member includes a clamping hole on both sides thereof. The clamping hole is adapted to clamp with the clamping member.

The first terminal module and the second terminal module are formed by using different molds, and therefore the assembly of the first plug terminals and the first combining portion on the first insulated member becomes easy. Similarly, the assembly of the second plug terminals and the second combining portion on the second insulated member becomes easy. No additional Mylar film is required because no terminal groove appears on the outer surface of the first insulated member and the second insulated member.

Furthermore, the first plug terminals and the second plug terminals are arranged upside down, and the pin-assignment of the first flexible contact portions is left-right reversal with respect to that of the second flexible contact portions. Accordingly, the electrical plug connector can have a 180 degree symmetrical, dual or double orientation design and pin assignments which enables the electrical plug connector to be mated with a corresponding receptacle connector in either of two intuitive orientations, i.e. in either upside-up or upside-down directions. When the electrical plug connector is inserted into a corresponding electrical receptacle connector with a first orientation, the first flexible contact portions of the electrical plug connector are in contact with the upper-row terminals of the electrical receptacle connector. When the electrical plug connector is inserted into the electrical receptacle connector with a second orientation, the second flexible contact portions of the electrical plug connector are in contact with the upper-row terminals of the electrical receptacle connector. Accordingly, the inserting orientation of the electrical plug connector is not limited by the electrical receptacle connector.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
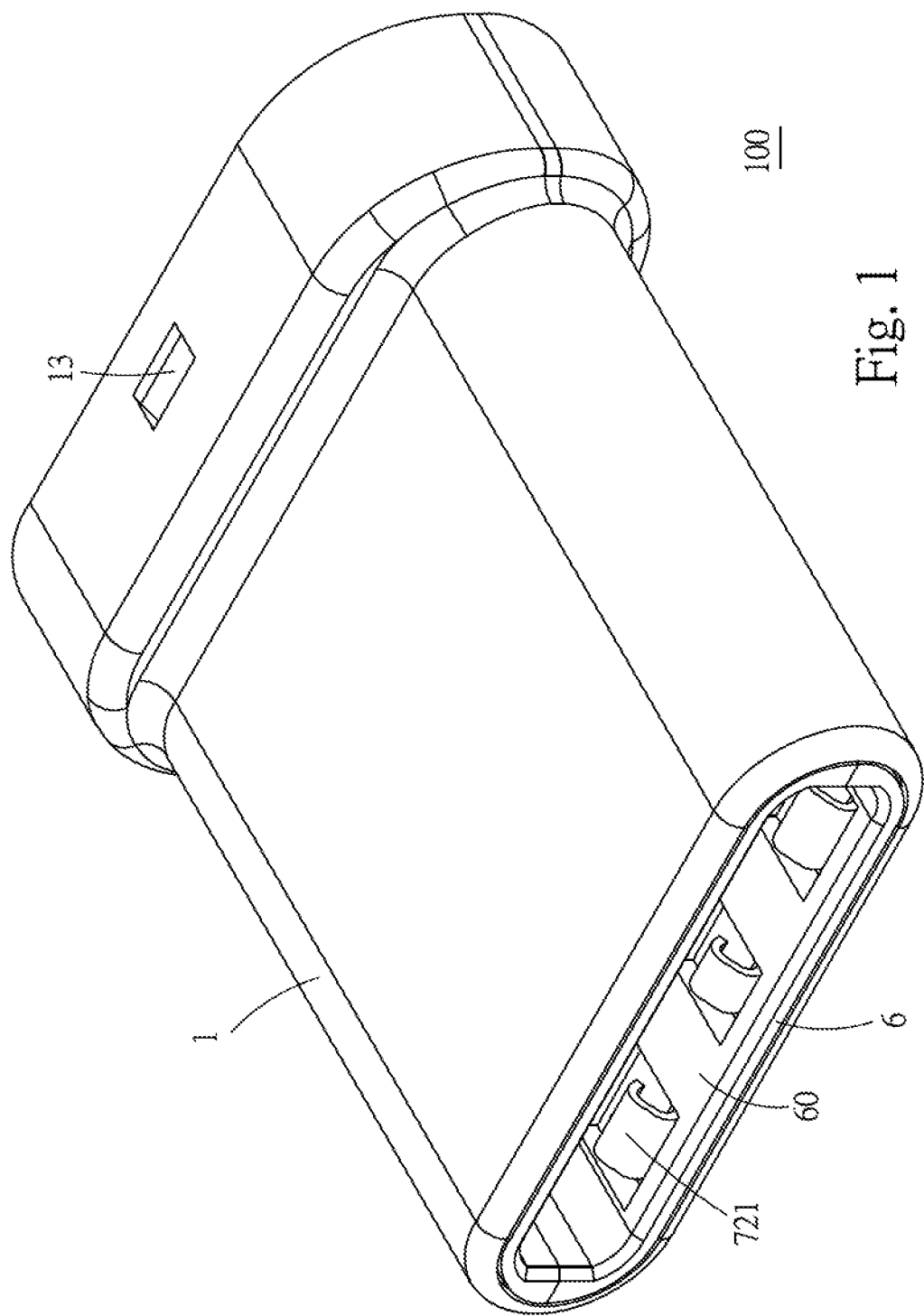
FIG. 1 illustrates a perspective view of an electrical plug connector according to an exemplary embodiment of the instant disclosure.
Figure 2:
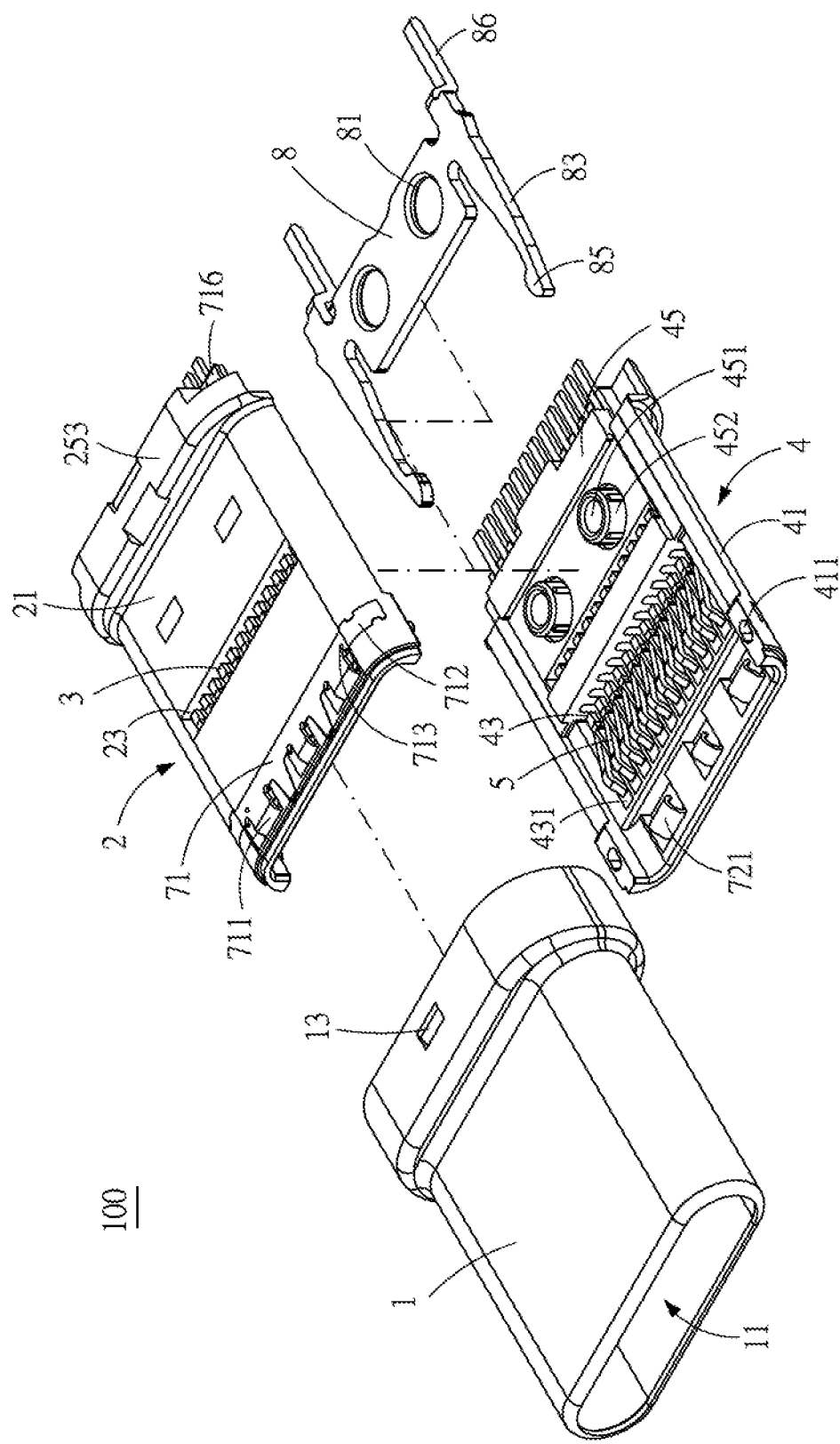
FIG. 2 illustrates an exploded view (1) of the electrical plug connector.
Figure 3:
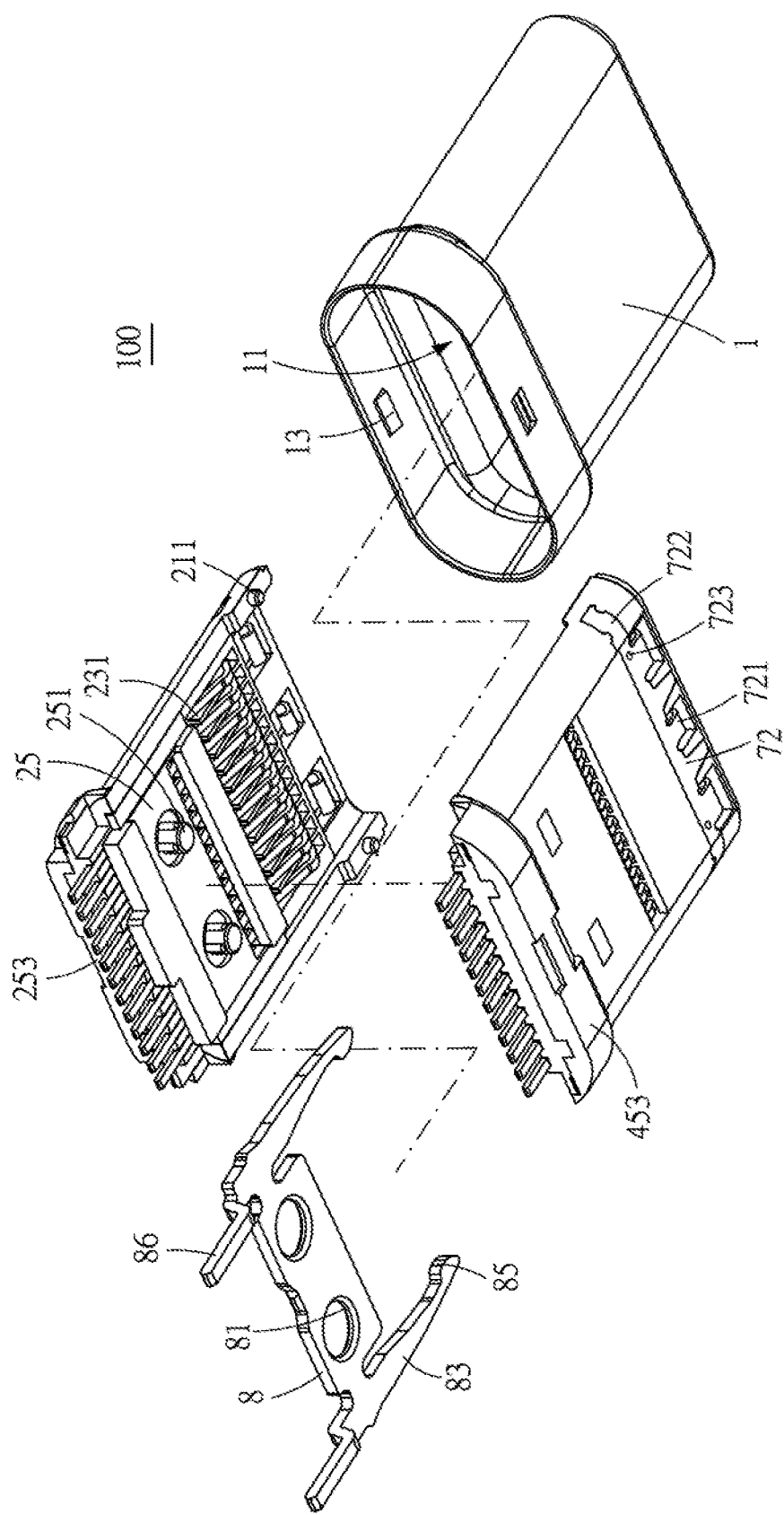
FIG. 3 illustrates an exploded view (2) of the electrical plug connector.

Referring to FIG. 1, FIG. 2, and FIG. 3, illustrating a perspective view, a top-down exploded view and a bottom-up exploded view, respectively, of an electrical plug connector 100 according to an exemplary embodiment of the instant disclosure. In this embodiment, the electrical plug connector 100 can provide a reversible or dual orientation USB Type-C connector interface and pin assignments, i.e., a USB Type-C plug connector. In this embodiment, the electrical plug connector 100 includes a metallic shell 1, a first terminal module 2, and a second terminal module 4.

Referring to FIG. 1 and FIG. 2, in this embodiment, the metallic shell 1 is a hollowed shell formed by deep drawing techniques. In other words, the metallic shell 1 is a one-piece seamless shell with a nice-looking appearance and improved structural strength. Moreover, the metallic shell 1 has a receiving cavity 11 surrounded thereby. The first insulated member 21 and the second insulated member 41 are disposed in the receiving cavity 11 of the metallic shell 1. In this embodiment, the metallic shell 1 is a one-piece shell structure, to which the scope of this disclosure is not limited. In some embodiments, multiple pieces may be bent to form the metallic shell 1.

Figure 4:
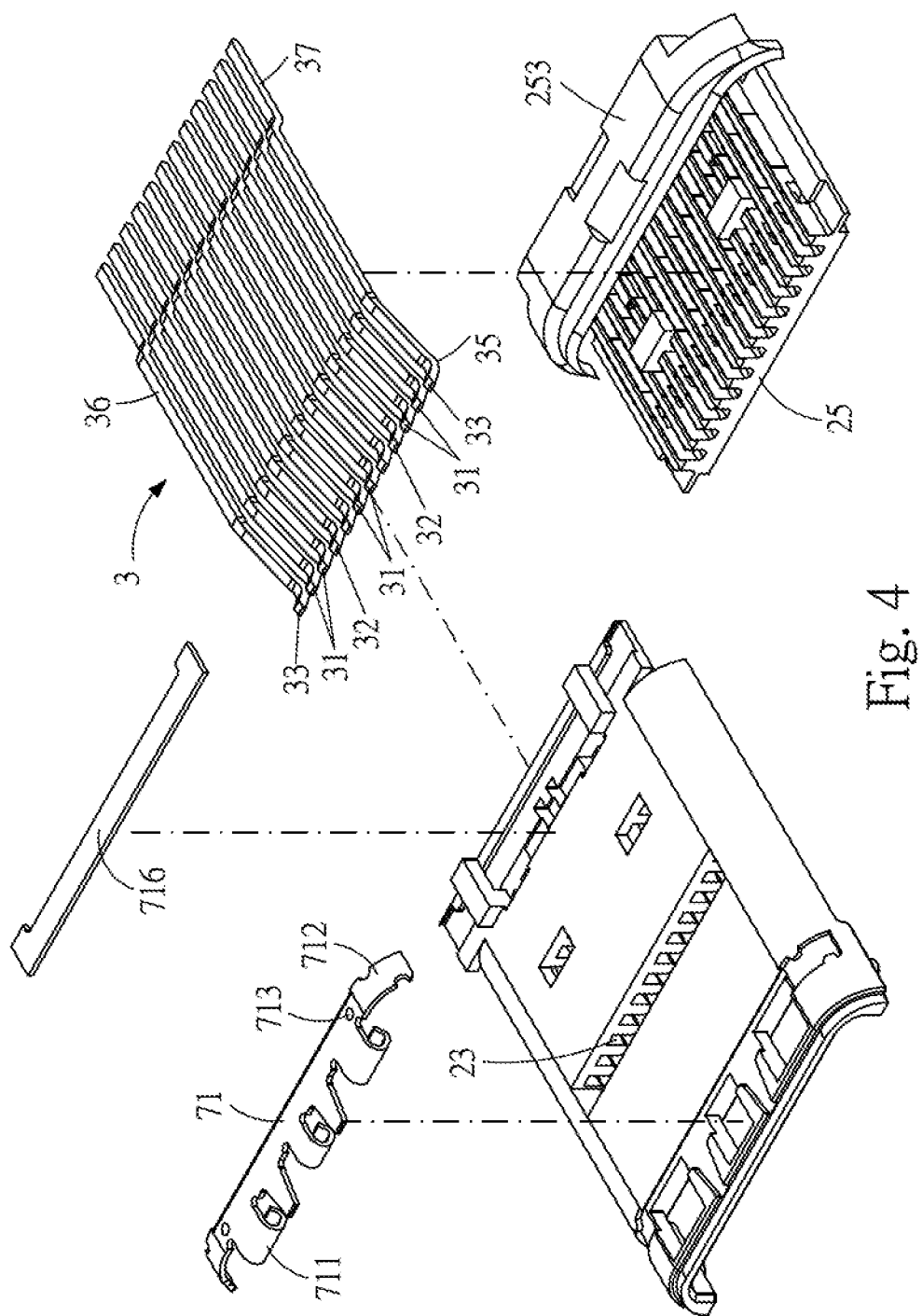
FIG. 4 illustrates an exploded view of a first terminal module of the electrical plug connector.
Figure 5:
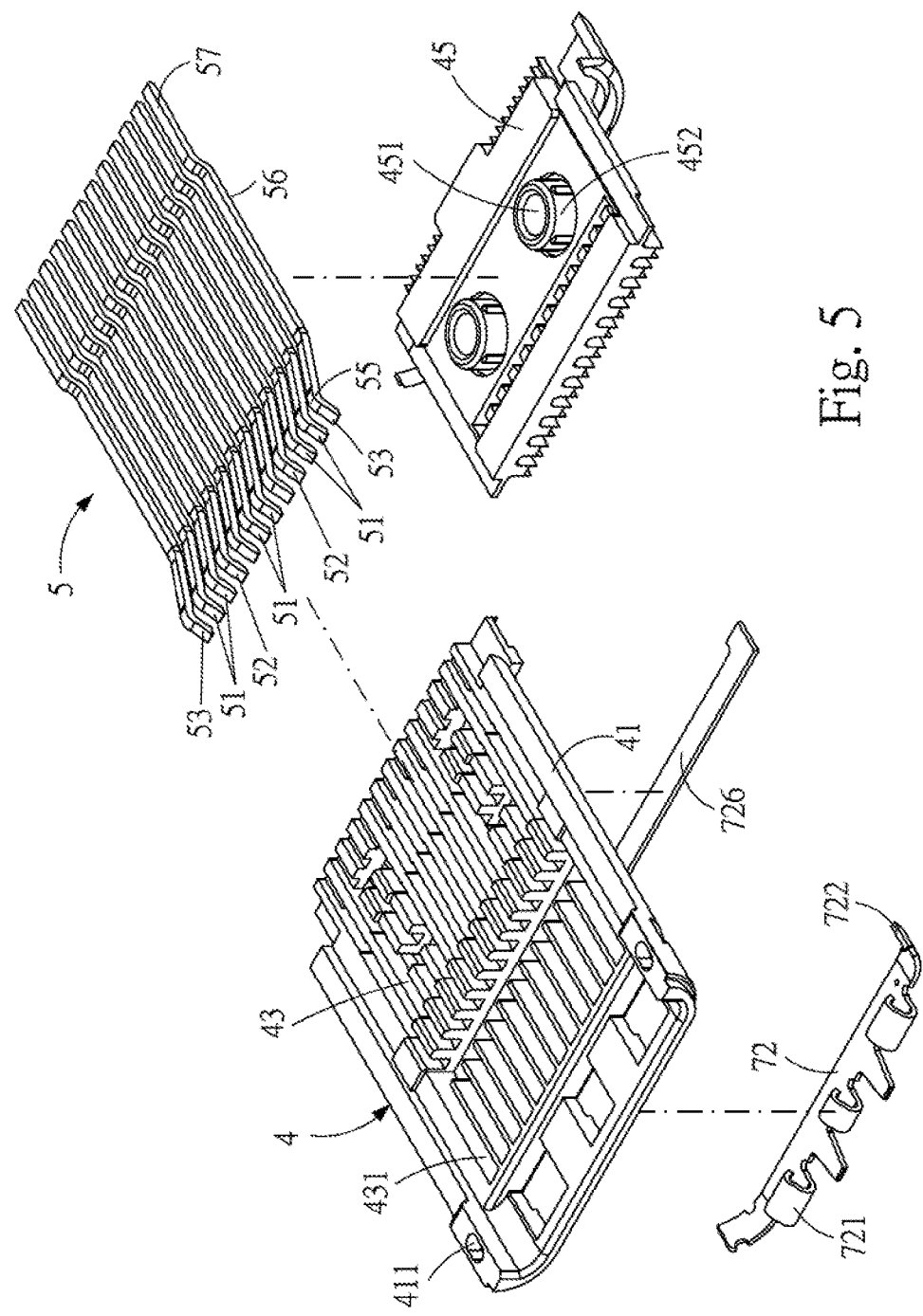
FIG. 5 illustrates an exploded view of a second terminal module of the electrical plug connector.

Referring to FIG. 2 to FIG. 5, where FIG. 4 and FIG. 5 illustrate an exploded view of a first terminal module 2 and a second terminal module 4 of the electrical plug connector 100, respectively. The first terminal module 2 includes a first insulated member 21, a plurality of first plug terminals 3, a first combining portion 25, and a first conductive strip 71. The first conductive strip 71 is disposed on the first insulated member 21. The first insulated member 21 and the first conductive strip 71 are combined as one (either by assembly or by one-piece formation). In this embodiment, the first insulated member 21 and the first conductive strip 71 are combined by insert-molding. More particularly, in one embodiment, the first insulated member 21 is formed based on the first conductive strip 71.

Referring to FIG. 2 to FIG. 5, a first fixing member 251 is formed on an inner surface of the first insulated member 21. The first fixing member 251 has a protuberant structure. In this embodiment, a plurality of first terminal grooves 23 is formed on the inner surface of the first insulated member 21. The first plug terminals 3 are positioned in the first terminal grooves 23. The first combining portion 25 is formed on the inner surface of the first insulated member 21 and combined with the first plug terminals 3. One side of the first combining portion 25 extends outwards to form the first fixing member 251. The first combining portion 25 includes a first base 253 as an extension from the rear portion of the first insulated member 21. The first plug terminals 3 include a plurality of first signal terminals 31, at least one first power terminal 32 and at least one first ground terminal 33.

Referring to FIG. 2 to FIG. 5, in this embodiment, the second terminal module 4 includes a second insulated member 41, a plurality of second plug terminals 5, a second combining portion 45, and a second conductive strip 72. The second conductive strip 72 is disposed on the second insulated member 41. The second insulated member 41 and the second conductive strip 72 are combined as one (either by assembly or by one-piece formation). In this embodiment, the second insulated member 41 and the second conductive strip 72 are combined by insert-molding. More particularly, in one embodiment, the second insulated member 41 is formed based on the second conductive strip 72.

Referring to FIG. 2 to FIG. 5, a second fixing member 451 is formed on an inner surface of the second insulated member 41 and is buckled with the first fixing member 251. The second fixing member 451 has a buckle groove structure. In this embodiment, a plurality of second terminal grooves 43 is formed on the inner surface of the second insulated member 41. The second plug terminals 5 are positioned in the second terminal grooves 43. The second combining portion 45 is formed on the inner surface of the second insulated member 41 and combined with the second plug terminals 5. The second fixing member 451 is disposed on a first side of the second combining portion 45. The second fixing member 451 is buckled with the first fixing member 251. The second combining portion 45 includes a second base 453 as an extension from the rear portion of the second insulated member 41. The second plug terminals 5 include a plurality of second signal terminals 51, at least one second power terminal 52, and at least one second ground terminal 53.

Referring to FIG. 2 to FIG. 5, in this embodiment, both the first insulated member 21 and the second insulated member 41 are half-tubular elongated plates. The first insulated member 21 and the second insulated member 41 are regularly shaped and being symmetrical in top-to-bottom direction as well as in right-to-left direction. The first insulated member 21 and the first combining portion 25 are formed by using one plastic injection mold, while the second insulated member 41 and the second combining portion 45 are formed by using another plastic injection mold. In other words, the first terminal module 2 and the second terminal module 4 are formed by using different plastic injection molds. More particularly, in one embodiment, the first combining portion 25 with the first fixing member 251 and the second combining portion 45 with the second fixing member 451 have different structures and are manufactured by using different molds.

Figure 6:
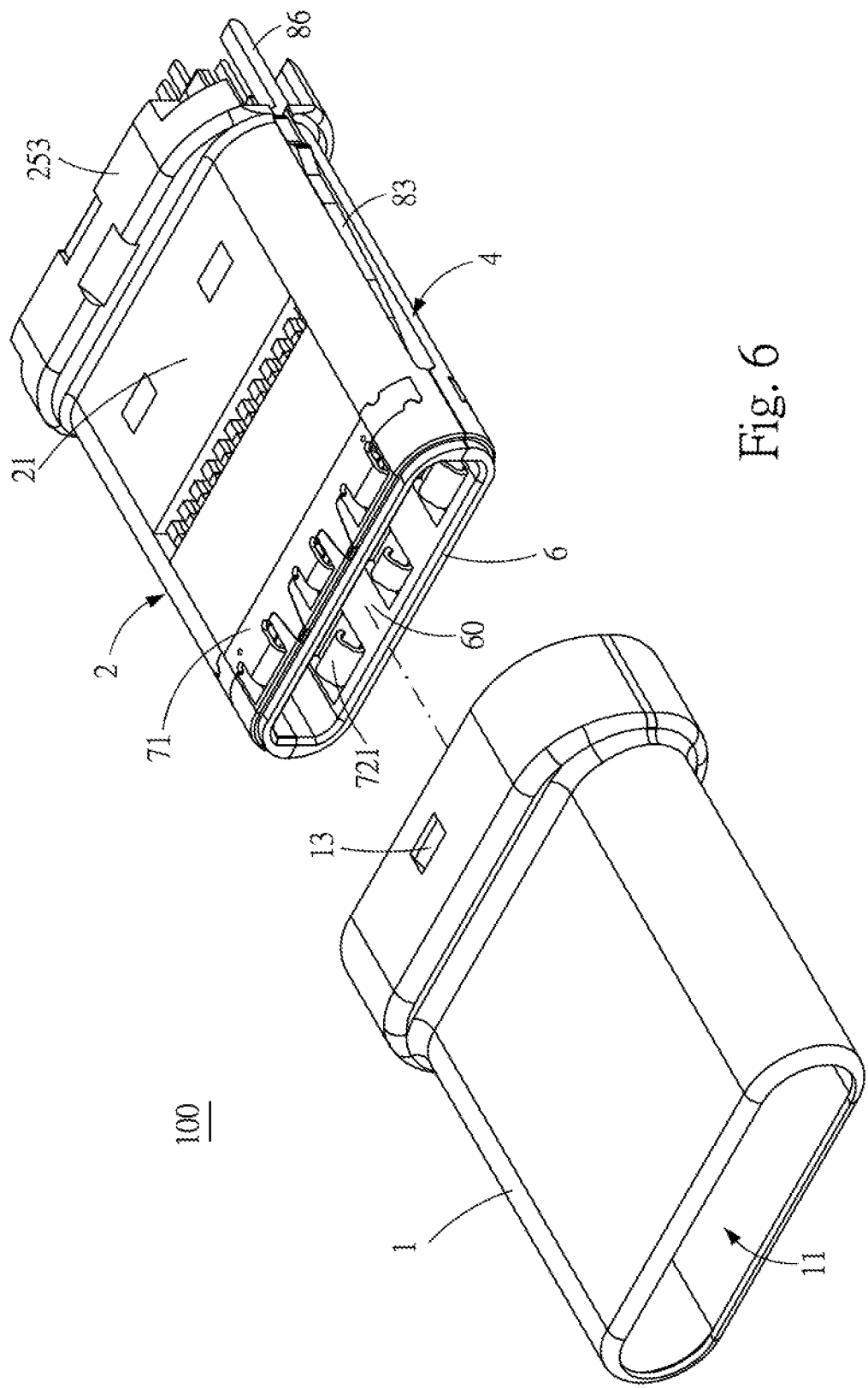
FIG. 6 illustrates a perspective view of the electrical plug connector being assembled.

Referring to FIG. 2 to FIG. 6, where FIG. 6 illustrates a perspective view of the electrical plug connector being assembled. The first insulated member 21 is combined with the second insulated member 41 to form a tubular member 6 inserted into a receiving cavity 11 surrounded by the metallic shell 1. The tubular member 6 surrounds a mating room 60, such that the electrical plug connector 100 can be mated with an electrical receptacle connector (not shown). A fastening piece 13 is provided on both of the upper inner side and the bottom inner side of the rear portion of the metallic shell 1 to buckle with the first combining portion 25 and the second combining portion 45, respectively.

Figure 7:
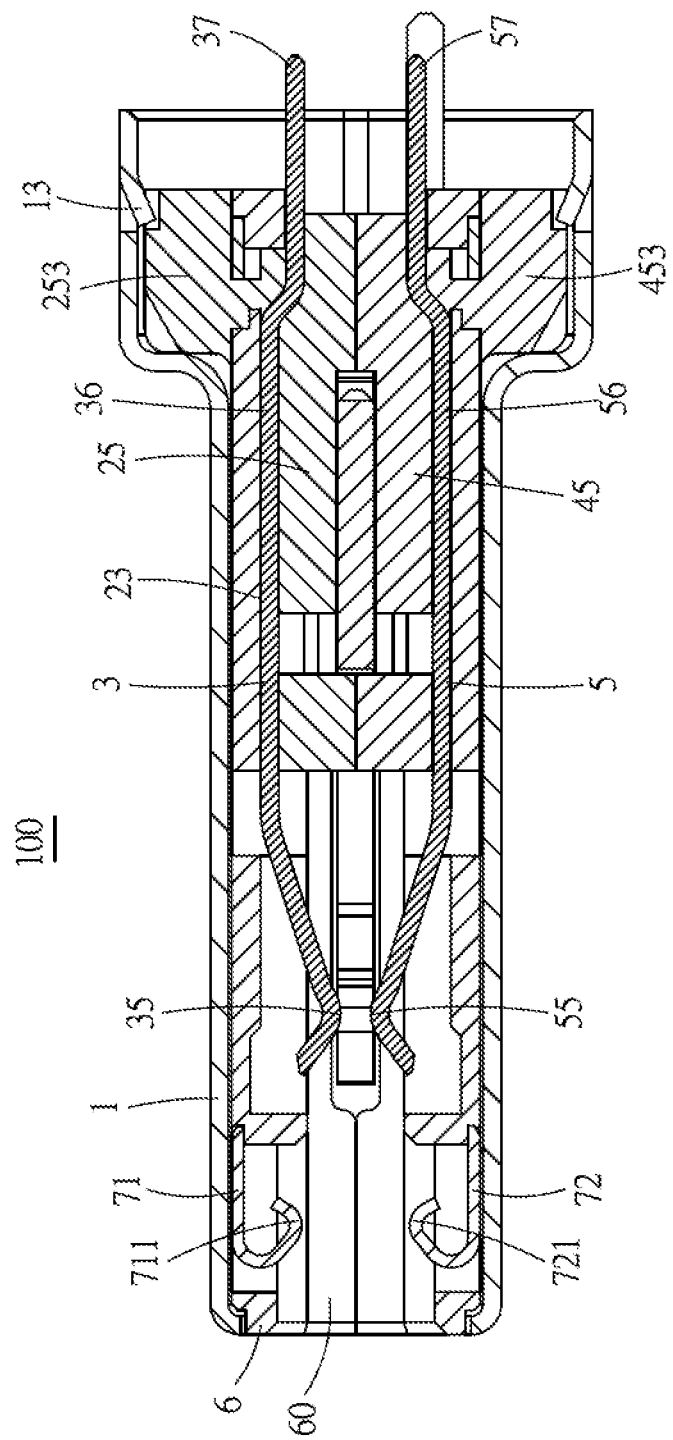
FIG. 7 illustrates a cross-sectional view of the electrical plug connector.
Figure 8:
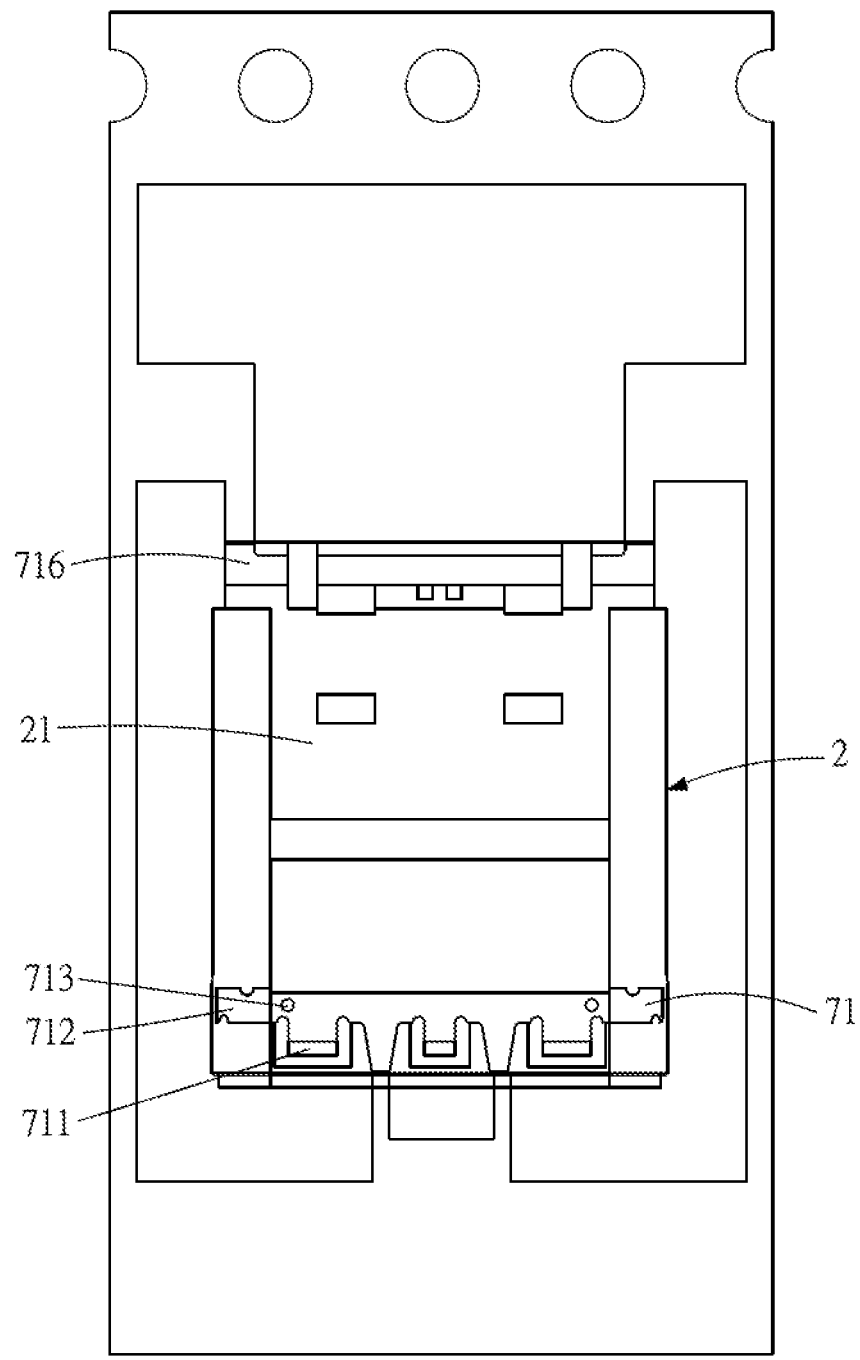
FIG. 8 illustrates a top view (1) of the electrical plug connector being manufactured.
Figure 9:
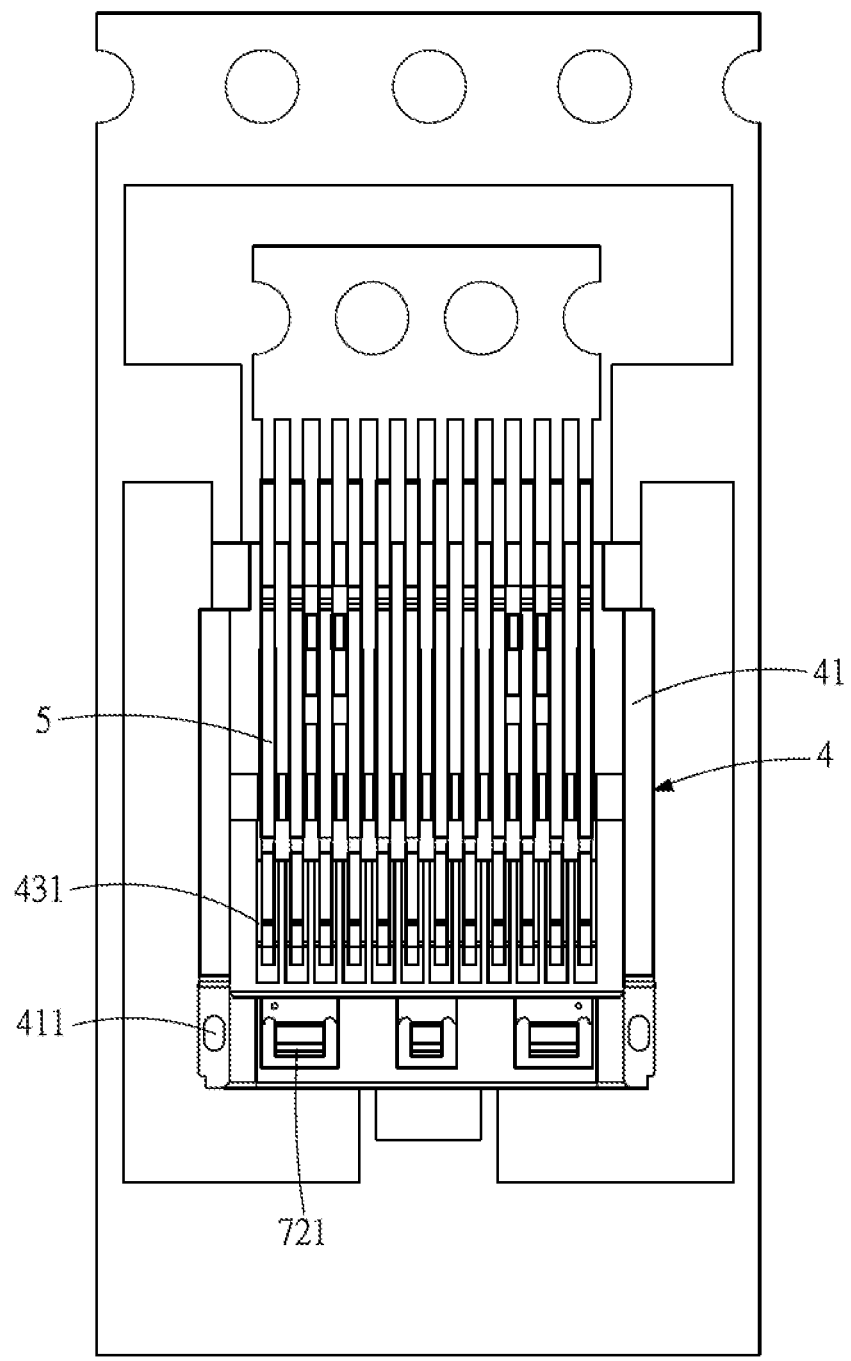
FIG. 9 illustrates a top view (2) of the electrical plug connector being manufactured.
Figure 10:
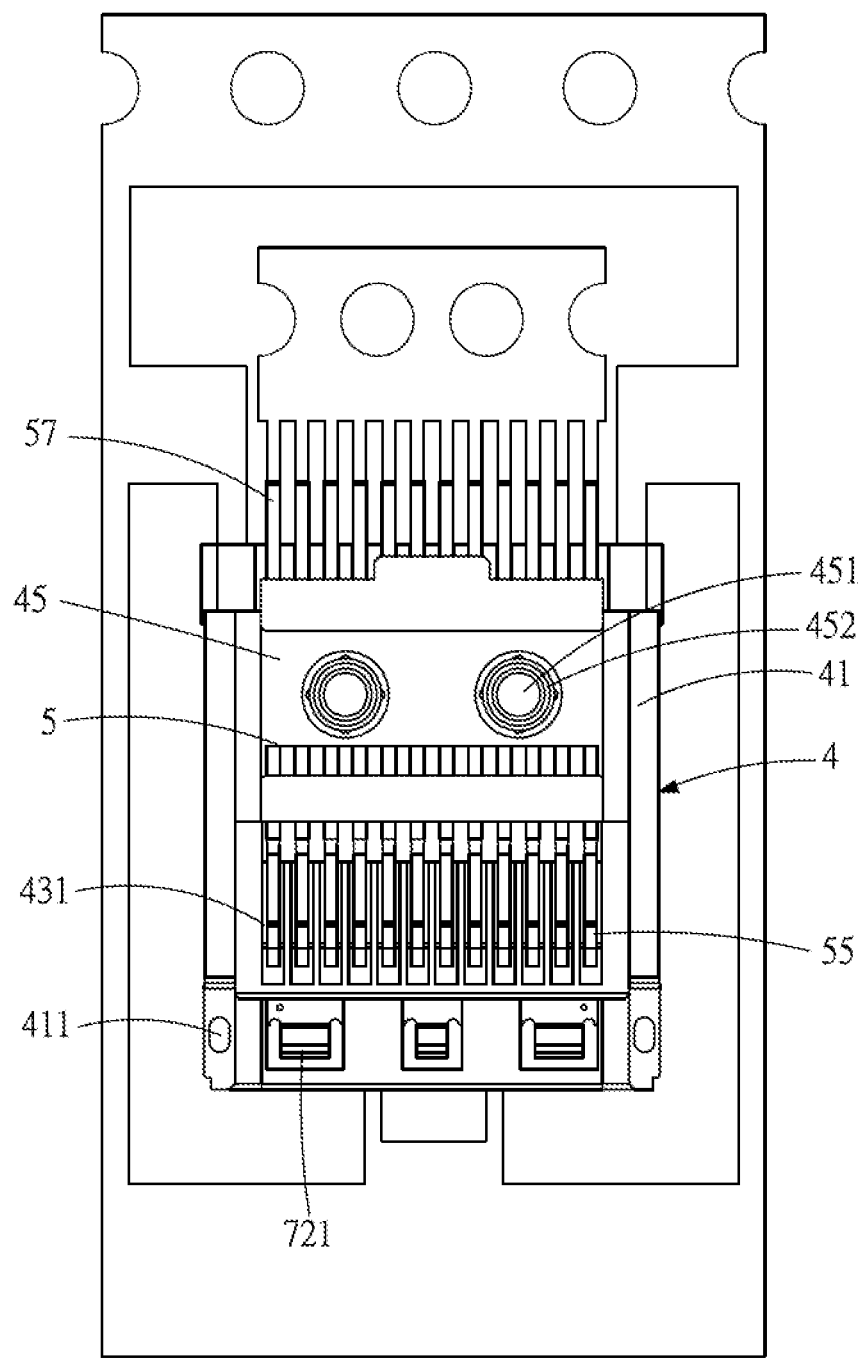
FIG. 10 illustrates a top view (3) of the electrical plug connector being manufactured.

Please refer to FIG. 4, and FIG. 7 to FIG. 10, where FIG. 7 illustrates a cross-sectional view of the electrical plug connector, FIG. 8 illustrates a top view of the electrical plug connector being manufactured by a first molding process, FIG. 9 illustrates a top view of the electrical plug connector being manufactured by a second molding process to form the second plug terminals 5, and FIG. 10 illustrates a top view of the electrical plug connector being manufactured by the second molding process to form the second combining portion 45. In this embodiment, during a first molding process for the manufacture of the first terminal module 2, the first insulated member 21 is insert-molded with the first conductive strip 71 and the first fixing strip 716 to be combined with the first conductive strip 71 and the first fixing strip 716. Then, a plurality of first plug terminals 3 are formed on the first insulated member 21. During a second molding process of the first terminal module 3, the first combining portion 25 is formed on the inner surface of the first insulated member 21 and is combined with the first plug terminals 3. Then, the metallic belting connected to the first conductive strip 71 and the first fixing strip 716 is removed, and the metallic belting connected to the first plug terminals 3 is removed.

During a first molding process for the manufacture of the second terminal module 4, the second insulated member 41 is insert-molded with the second conductive strip 72 and the second fixing strip 726 to be combined with the second conductive strip 72 and the second fixing strip 726. Then, a plurality of second plug terminals 5 are formed on the second insulated member 41. During a second molding process of the second terminal module 4, the second combining portion 45 is formed on the inner surface of the second insulated member 41 and is combined with the second plug terminals 5. Then, the metallic belting connected to the second conductive strip 72 and the second fixing strip 726 is removed, and the metallic belting connected to the second plug terminals 5 is removed.

Referring to FIG. 4, FIG. 7 to FIG. 10, the first combining portion 25 is formed by insert-molding to combine with the first body portions 36, and the second combining portion 45 is formed by insert-molding to combine with the second body portions 56. Then, the first combining portion 25 and the second combining portion 45 are respectively assembled above and under the grounding sheet 8. Finally, the semi-finished product including the grounding sheet 8, the first terminal module 2, and the second terminal module 4 is assembled with the receiving cavity 11 in the metallic shell 1.

Referring to FIG. 2, FIG. 3, FIG. 4 and FIG. 5, the first fixing strip 716 and the second fixing strip 726 are disposed at the rear portion of first insulated member 21 and the second insulated member 41, respectively.

Referring to FIG. 2, FIG. 3, FIG. 4 and FIG. 5, the first conductive strip 71 and the second conductive strip 72 are attached onto an outer surface of the first insulated member 21 and an outer surface of the second insulated member 71, respectively, and the first conductive strip 71 and the second conductive strip 72 include a plurality of first resilient arms 711 and a plurality of second resilient arms 721 extending into the mating room 60, respectively.

Referring to FIG. 2, FIG. 3, FIG. 4 and FIG. 5, the first conductive strip 71 includes a first side-positioning piece 712 and a first contact member 713 on both ends thereof, and the second conductive strip 72 includes a second side-positioning piece 722 and a second contact member 723 on both ends thereof. The first side-positioning piece 712 and the second side-positioning piece 722 are attached onto the first insulated member 21 and the second insulated member 41, respectively. The first contact member 713 and the second contact member 723 contact an inner surface of the metallic shell 1.

Referring to FIG. 2, FIG. 3, FIG. 4 and FIG. 5, a protuberant column 452 forming the second fixing member 451 is disposed on the first side of the second combining portion 45. The electrical plug connector 100 further includes a grounding sheet 8 disposed between the first insulated member 21 and the second insulated member 41. A buttonhole 81 penetrating through the protuberant column 452 is formed on the grounding sheet 8.

Referring to FIG. 2, FIG. 3, FIG. 4 and FIG. 5, the first insulated member 21 includes a clamping member 211 on both sides thereof, and the second insulated member 41 includes a clamping hole 411 on both sides thereof. The clamping hole 411 is adapted to clamp with the clamping member 211.

Referring to FIG. 2, FIG. 3, FIG. 4 and FIG. 5, one of a plurality of first limiting grooves 231 is formed at a front end of each of the first terminal grooves 23 on the inner surface of the first insulated member 21 and one of a plurality of second limiting grooves 431 is formed at a front end of each of the second terminal grooves 43 on the inner surface of the second insulated member 41.

Referring to FIG. 2 to FIG. 5 and FIG. 7, the first plug terminals 3 include a plurality of first signal terminals 31, at least one first power terminal 32, and at least one first ground terminal 33. Viewing from the front end of the first plug terminals 3, the first plug terminals 3 are, from right to left, a first ground terminal (Gnd) 33, a first pair of first high-speed signal terminals (TX1+−, differential signals) 31, a first power terminal (Power/VBUS) 32, a first function detection terminal (CC1, detection for inserting orientation and cable recognition), a pair of first low-speed signal terminals (D+−, differential signals) 31, a first reserved terminal (RFU), another first power terminal (Power/VBUS) 32, a second pair of first high-speed signal terminals (RX2+−, differential signals) 31, and a leftmost first grounding terminal (Gnd) 33.

Referring to FIG. 2 to FIG. 5 and FIG. 7 again, each of the first plug terminals 3 includes a first flexible contact portion 35, a first body portion 36, and a first tail portion 37. The first body portion 36 is disposed on the first combining portion 25. The first flexible contact portion 35 extends forward, in the rear-to-front direction, from the first body portion 36 to one of the first limiting grooves 231. The first tail portion 37 extends backward, in the front-to-rear direction, from the first body portion 36 to penetrate through the first combining portion 25. The first flexible contact portion 35 has an arc structure. The first signal terminals 31 extend into the mating room 60 to transmit first signals (i.e., USB 3.0 signals).

Referring to FIG. 2 to FIG. 5 and FIG. 7 again, the second plug terminals 5 include a plurality of second signal terminals 51, at least one second power terminal 52 and at least one second ground terminal 53. Viewing from the front end of the second plug terminals 5, the second plug terminals 5 are, from left to right, a second ground terminal (Gnd) 53, a first pair of second high-speed signal terminals (TX2+−, differential signals) 51, a second power terminal (Power/VBUS) 52, a second function detection terminal (CC2, detection for inserting orientation and cable recognition), a pair of second low-speed signal terminals (D+−, differential signals) 51, a second reserved terminal (RFU), another second power terminal (Power/VBUS) 52, a second pair of second high-speed signal terminals (RX1+−, differential signals) 51, and a rightmost second ground terminal (Gnd) 33.

Referring to FIG. 2 to FIG. 5 and FIG. 7 again, each of the second plug terminals 5 includes a second flexible contact portion 55, a second body portion 56, and a second tail portion 57. The second body portion 56 is disposed on the second combining portion 45. The second flexible contact portion 55 extends forward, in the rear-to-front direction, from one end of the second body portion 56 to one of the second limiting grooves 431. The second tail portion 57 extends backward, in the front-to-rear direction, from the other end of the second body portion 56 to penetrate through the second combining portion 45. The second flexible contact portion 55 has an arc structure corresponding to the first flexible contact portion 35. In other words, each of the first flexible contact portions 35 has an opposite curvature to that of one corresponding second flexible contact portion 55, such that each first tail portion 37 and one corresponding second tail portion 57 form a clamping resilient arm for holding and contacting a circuit board. Moreover, the first signal terminals 51 extend into the mating room 60 to transmit second signals (i.e., USB 3.0 signals).

Referring to FIG. 2 to FIG. 5 and FIG. 7 again, in this embodiment, it would be apparent that, from the pin-assignment of the first plug terminals 3 and the second plug terminals 5, the first plug terminals 3 and the second plug terminals 5 are disposed on the lower surface of the first insulated member 21 and on the upper surface of the second insulated member 41, respectively, and the first plug terminals 3 and the second plug terminals 5 are point-symmetric with respect to the center of the receiving cavity 11 as a center of symmetry. The dual or double orientation design enables the electrical plug connector 100 to be inserted into an electrical receptacle connector in either of two intuitive orientations, i.e., in either upside-up or upside-down directions. Herein, the term "point-symmetric" indicates that the first plug terminals 3 and the second plug terminals 5 are overlapped as a result of 180-degree rotation of the first plug terminals 3 and the second plug terminals 5 around the center of symmetry. That is, the first plug terminals 3 that have undergone the 180-degree rotation are arranged where the second plug terminals 5 were originally disposed, while the second plug terminals 5 that have undergone the 180-degree rotation are arranged where the first plug terminals 3 were originally disposed.

In other words, the pin-assignment of the first plug terminals 3 is left-right reversal with respect to that of the second plug terminals 5. The electrical plug connector 100 may be inserted into an electrical receptacle connector with a first orientation to transmit the first signals. On the other hand, the electrical plug connector 100 may also be inserted into the electrical receptacle connector with a second orientation to transmit the second signals. The specification for transmitting the first signals conforms to the specification for transmitting the second signals. The inserting orientation of the electrical plug connector 100 is not limited by the electrical receptacle connector. Moreover, in this embodiment, viewing from the front end of the first plug terminals 3 and the second plug terminals 5, the first flexible contact portions 35 are arranged corresponding to the second flexible contact portions 55.

Referring to FIG. 2 to FIG. 5 and FIG. 7 again, in this embodiment, the electrical plug connector 100 further includes a grounding sheet 8. The grounding sheet 8 is formed by blanking, to which, however, the scope of the instant disclosure is not limited. In some embodiments, the grounding sheet 8 may also be formed by stamping. A grounding sheet 8 formed by blanking has a better structural strength than a grounding sheet 8 formed by stamping. In addition, the grounding sheet 8 is disposed between the first insulated member 21 and the second insulated member 41. Herein, the grounding sheet 8 includes a plurality of side arms 83. The grounding sheet 8 is generally a rectangular plate including a buttonhole 81. The protuberant column 452 is capable of penetrating through the buttonhole 81 to fix the grounding sheet 8 between the first insulated member 21 and the second insulated member 41. Each of the side arms 83 is an elongate pin structure. The side arms 83 are symmetrical with each other, i.e., a first side arm 83 is mirrored with respect to its corresponding second side arm 83. The side arms 83 are extended from both sides of the grounding sheet 8 to insert into the mating room 60. Each of the side arms 83 further includes a resilient contact portion 85 and a leg 86. The resilient contact portion 85 is formed at the front end of its corresponding side arm 83 such that the resilient contact portion 85 is capable of contacting an electrical receptacle connector. When the electrical plug connector 100 is in contact with an electrical receptacle connector, the resilient contact portion 85 is adapted to fixedly hold the electrical receptacle connector. Moreover, the leg 86 is extended outwards from the rear portion of the side arm 83 to penetrate through the first insulated member 21 and the second insulated member 41 to contact a circuit board.

The first terminal module and the second terminal module are formed by using different molds, and therefore the assembly of the first plug terminals and the first combining portion on the first insulated member becomes easy. Similarly, the assembly of the second plug terminals and the second combining portion on the second insulated member becomes easy. No additional Mylar film is required because no terminal groove appears on the outer surface of the first insulated member and the second insulated member.

Furthermore, the first plug terminals and the second plug terminals are arranged upside down, and the pin-assignment of the first flexible contact portions is left-right reversal with respect to that of the second flexible contact portions. Accordingly, the electrical plug connector can have a 180 degree symmetrical, dual or double orientation design and pin assignments which enables the electrical plug connector to be mated with a corresponding receptacle connector in either of two intuitive orientations, i.e. in either upside-up or upside-down directions. When the electrical plug connector is inserted into a corresponding electrical receptacle connector with a first orientation, the first flexible contact portions of the electrical plug connector are in contact with the upper-row terminals of the electrical receptacle connector. When the electrical plug connector is inserted into the electrical receptacle connector with a second orientation, the second flexible contact portions of the electrical plug connector are in contact with the upper-row terminals of the electrical receptacle connector. Accordingly, the inserting orientation of the electrical plug connector is not limited by the electrical receptacle connector.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electrical plug connector, comprising:
   a metallic shell surrounding a receiving cavity;
   a first terminal module comprising a first insulated member, a plurality of first plug terminals, and a first conductive strip, wherein the first conductive strip is disposed on the first insulated member, a plurality of first terminal grooves and a first fixing member are formed on an inner surface of the first insulated member, and the first plug terminals are positioned in the first terminal grooves, wherein the first conductive strip comprises a plurality of first resilient arms; and
   a second terminal module comprising a second insulated member, a plurality of second plug terminals, and a second conductive strip, wherein the second conductive strip is disposed on the second insulated member, a plurality of second terminal grooves and a second fixing member are formed on an inner surface of the second insulated member, the second plug terminals are positioned in the second terminal grooves, and the second fixing member is buckled with the first fixing member, wherein the second conductive strip comprises a plurality of second resilient arms;
   wherein the first insulated member is combined with the second insulated member to form a tubular member, the tubular member is inserted into the receiving cavity of the metallic shell, the tubular member surrounds a mating room, and the first resilient arms and the second resilient arms are extending into the mating room, respectively.

2. The electrical plug connector according to claim 1, wherein the first insulated member comprises a first combining portion formed on the inner surface of the first insulated member and combined with the first plug terminals, the first fixing member being disposed on one side of the first combining portion.

3. The electrical plug connector according to claim 2, wherein the first insulated member extends to form a first base disposed at one end of the first combining portion.

4. The electrical plug connector according to claim 2, wherein the first plug terminals comprise a plurality of first signal terminals, at least one first power terminal, and at least one first ground terminal.

5. The electrical plug connector according to claim 2, wherein one of a plurality of first limiting grooves is formed at a front end of each of the first terminal grooves on the inner surface of the first insulated member and one of a plurality of second limiting grooves is formed at a front end of each of the second terminal grooves on the inner surface of the second insulated member.

6. The electrical plug connector according to claim 5, wherein each of the first plug terminals comprises a first flexible contact portion, a first body portion, and a first tail portion, the first body portion is disposed on the first combining portion, the first flexible contact portion is extending forward, in the rear-to-front direction, from the first body portion to one of the first limiting grooves, and the first tail portion is extending backward, in the front-to-rear direction, from the first body portion to penetrate through the first combining portion.

7. The electrical plug connector according to claim 5, wherein the second insulated member comprises a second combining portion formed on the inner surface of the second insulated member and combined with the second plug terminals, the second fixing member is disposed on a first side of the second combining portion.

8. The electrical plug connector according to claim 7, wherein the second insulated member extends to form a second base disposed at one end of the second combining portion.

9. The electrical plug connector according to claim 7, wherein each of the second plug terminals comprises a second flexible contact portion, a second body portion, and a second tail portion, the second body portion is disposed on the second combining portion, the second flexible contact portion is extending forward, in the rear-to-front direction, from the second body portion to one of the second limiting grooves, the second tail portion is extending backward, in the front-to-rear direction, from the second body portion to penetrate through the second combining portion.

10. The electrical plug connector according to claim 7, wherein the second plug terminals comprise a plurality of second signal terminals, at least one second power terminal, and at least one second ground terminal.

11. The electrical plug connector according to claim 7, wherein a protuberant column forming the second fixing member is disposed on the first side of the second combining portion.

12. The electrical plug connector according to claim 11, further comprising a grounding sheet disposed between the first insulated member and the second insulated member, wherein a buttonhole penetrating through the protuberant column is formed on the grounding sheet.

13. The electrical plug connector according to claim 1, further comprising a first fixing strip disposed on one end of the first insulated member and a second fixing strip disposed on one end of the second insulated member.

14. The electrical plug connector according to claim 1, wherein the first conductive strip and the second conductive strip are attached onto an outer surface of the first insulated member and an outer surface of the second insulated member, respectively.

15. The electrical plug connector according to claim 14, wherein the first conductive strip comprises a first side-positioning piece and a first contact member on both ends thereof and the second conductive strip comprises a second side-positioning piece and a second contact member on both ends thereof, the first side-positioning piece and the second side-positioning piece being attached onto the first insulated member and the second insulated member, respectively, and the first contact member and the second contact member is contact an inner surface of the metallic shell.

16. The electrical plug connector according to claim 1, wherein the first insulated member comprises a clamping member on both sides thereof and the second insulated member comprises a clamping hole on both sides thereof, the clamping hole is adapted to clamp with the clamping member.

17. The electrical plug connector according to claim 1, wherein the first conductive strip comprises a first contact member and the second conductive strip comprises a second contact member, and the first contact member and the second contact member is contact an inner surface of the metallic shell.

* * * * *